United States Patent
Lin et al.

(10) Patent No.: US 11,693,089 B2
(45) Date of Patent: *Jul. 4, 2023

(54) APPARATUS AND METHOD FOR APPLYING FREQUENCY CALIBRATION TO LOCAL OSCILLATOR SIGNAL DERIVED FROM REFERENCE CLOCK OUTPUT OF ACTIVE OSCILLATOR

(71) Applicant: MEDIATEK INC., Hsin-Chu (TW)

(72) Inventors: Tzu-Chin Lin, Hsinchu (TW);
Chih-Ming Hung, San Jose, CA (US);
Jui-Lin Hsu, Hsinchu (TW);
Chao-Ching Hung, Hsinchu (TW);
Bao-Chi Peng, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/558,502

(22) Filed: Dec. 21, 2021

(65) Prior Publication Data

US 2022/0113374 A1  Apr. 14, 2022

Related U.S. Application Data

(63) Continuation of application No. 16/168,853, filed on Oct. 24, 2018, now Pat. No. 11,237,249.

(Continued)

(51) Int. Cl.
*G01S 7/40*        (2006.01)
*H03J 7/04*        (2006.01)
(Continued)

(52) U.S. Cl.
CPC .......... *G01S 7/4021* (2013.01); *G01S 7/4008* (2013.01); *G01S 7/4056* (2013.01);
(Continued)

(58) Field of Classification Search
None
See application file for complete search history.

(56) References Cited

U.S. PATENT DOCUMENTS

| 5,920,278 | A  | 7/1999 | Tyler |
| 6,777,684 | B1 | 8/2004 | Volkov |

(Continued)

FOREIGN PATENT DOCUMENTS

| CN | 105075110 A | 11/2015 |
| CN | 105116018 A | 12/2015 |

(Continued)

OTHER PUBLICATIONS

Joonsung Bae et al., A Low Energy Crystal-Less Double-FSK Transceiver for Wireless Body-Area-Network, IEEE Asian Solid-State Circuits Conference,Nov. 14-16, 2011, Jeju, Korea, pp. 181-184, XP032090607.

(Continued)

*Primary Examiner* — Whitney Moore
(74) *Attorney, Agent, or Firm* — Winston Hsu

(57) ABSTRACT

A system includes a local oscillator (LO) signal generation circuit, a receiver (RX) circuit, and a calibration circuit. The LO signal generation circuit generates an LO signal according to a reference clock, and includes an active oscillator that generates the reference clock. The active oscillator includes at least one active component. The RX circuit generates a processed RX signal by processing an RX input signal according to the LO signal. The calibration circuit checks a signal characteristic of the processed RX signal by detecting if a calibration tone exists within a receiver bandwidth, set a frequency calibration control output in response to the calibration tone being not found in the receiver bandwidth, and output the frequency calibration control output to the LO signal generation circuit. The LO signal generation (Continued)

circuit adjusts an LO frequency of the LO signal in response to the frequency calibration control output.

28 Claims, 7 Drawing Sheets

Related U.S. Application Data

(60) Provisional application No. 62/642,653, filed on Mar. 14, 2018, provisional application No. 62/620,002, filed on Jan. 22, 2018.

(51) Int. Cl.

| | |
|---|---|
| *H03J 7/06* | (2006.01) |
| *H03L 7/183* | (2006.01) |
| *H04B 17/21* | (2015.01) |
| *G01S 13/02* | (2006.01) |
| *G01S 13/88* | (2006.01) |

(52) U.S. Cl.
CPC .......... *G01S 13/0209* (2013.01); *G01S 13/88* (2013.01); *H03J 7/04* (2013.01); *H03J 7/065* (2013.01); *H03L 7/183* (2013.01); *H04B 17/21* (2015.01)

(56) References Cited

U.S. PATENT DOCUMENTS

| | | |
|---|---|---|
| 6,972,709 B1 | 12/2005 | Deem |
| 7,002,511 B1 | 2/2006 | Ammar |
| 7,236,212 B2 | 6/2007 | Carr |
| 7,750,841 B2 | 7/2010 | Oswald |
| 7,773,205 B2 | 8/2010 | Cooper |
| 7,915,935 B1 | 3/2011 | Menon |
| 8,135,055 B2 | 3/2012 | Kohlmann |
| 8,254,865 B2 | 8/2012 | Soul |
| 8,264,401 B1 | 9/2012 | Kavaler |
| 8,861,568 B2 | 10/2014 | Petersen |
| 9,239,376 B2 | 1/2016 | Mathews |
| 9,356,732 B2 | 5/2016 | Schubert |
| 9,407,199 B2 | 8/2016 | Pavao-moreira |
| 9,482,745 B2 | 11/2016 | Sickinger |
| 9,696,359 B2 | 7/2017 | Subburaj |
| 2002/0196881 A1 | 12/2002 | Kalveram |
| 2003/0199254 A1 | 10/2003 | Kusbel |
| 2007/0025491 A1 | 2/2007 | Jeong |
| 2009/0092177 A1 | 4/2009 | Dvorak |
| 2014/0270002 A1 | 9/2014 | Schubert |
| 2016/0109559 A1 | 4/2016 | Delbecq |
| 2016/0126964 A1 | 5/2016 | Huang |
| 2017/0115377 A1 | 4/2017 | Giannini |
| 2018/0031688 A1 | 2/2018 | Hesse |
| 2019/0178983 A1 | 6/2019 | Lin |

FOREIGN PATENT DOCUMENTS

| | | |
|---|---|---|
| EP | 1 748 559 A1 | 1/2007 |
| JP | 2008298736 A | 12/2008 |
| KR | 101604477 B1 | 3/2016 |
| WO | 2014145350 A1 | 9/2014 |
| WO | 2017179265 A1 | 10/2017 |

OTHER PUBLICATIONS

Joonsung Bae et al., "A Low Energy Crystal-Less Double-FSK Transceiver for Wireless Body-Area-Network", Nov. 14-16, 2011/ Jeju, Korea, pp. 181-182, IEEE Asian Solid-State Circuits Conference, 2011 IEEE.

APPARATUS AND METHOD FOR APPLYING FREQUENCY CALIBRATION TO LOCAL OSCILLATOR SIGNAL DERIVED FROM REFERENCE CLOCK OUTPUT OF ACTIVE OSCILLATOR

CROSS REFERENCE TO RELATED APPLICATION

This is a continuation of U.S. application Ser. No. 16/168,853 filed Oct. 24, 2018, which claims the benefit of U.S. provisional application No. 62/620,002 filed Jan. 22, 2018 and U.S. provisional application No. 62/642,653 filed Mar. 14, 2018. The entire contents of the related applications, including U.S. application Ser. No. 16/168,853, U.S. provisional application No. 62/620,002 and U.S. provisional application No. 62/642,653, are incorporated herein by reference.

BACKGROUND

The present invention relates to wireless communications, and more particularly, to an apparatus and method for applying frequency calibration to a local oscillator signal derived from a reference clock output of an active oscillator.

A transmitter (TX) circuit in a wireless system chip is used to perform an up-conversion process that converts a TX signal from a lower frequency to a higher frequency for signal transmission. A receiver (RX) circuit in the wireless system chip is used to perform a down-conversion process that converts an RX signal from a higher frequency to a lower frequency for signal reception. Further, each of the up-conversion process and the down-conversion process requires a local oscillator (LO) signal with a proper LO frequency setting. Typically, the LO signal is derived from a reference clock that is supplied from an off-chip oscillator. For example, the off-chip oscillator is a passive oscillator (e.g., a typical crystal oscillator (XO)). When the wireless system chip is used by an application device, the off-chip oscillator is also used by the application device due to the fact that the reference clock needed by the wireless system chip is supplied from the off-chip oscillator (e.g., XO). If the off-chip oscillator can be omitted, the BOM (bill of material) cost and the PCB (printed circuit board) area of the application device can be reduced. Thus, there is a need for an innovative crystal-less wireless system design. Further, the absolute frequency accuracy needs to be controlled to avoid violating the European Telecommunications Standards Institute (ETSI) or Federal Communications Commission (FCC) spectrum emission regulation. Thus, there is also a need for an innovative frequency calibration scheme.

SUMMARY

One of the objectives of the claimed invention is to provide an apparatus and method for applying frequency calibration to a local oscillator signal derived from a reference clock output of an active oscillator.

According to a first aspect, an exemplary system is disclosed. The exemplary system includes a local oscillator (LO) signal generation circuit, a receiver (RX) circuit, and a calibration circuit. The LO signal generation circuit is arranged to generate an LO signal according to a reference clock. The LO signal generation circuit includes an active oscillator that is arranged to generate the reference clock. The active oscillator includes at least one active component. The RX circuit is arranged to generate a processed RX signal by processing an RX input signal according to the LO signal. The calibration circuit is arranged to check a signal characteristic of the processed RX signal by detecting if a calibration tone exists within a receiver bandwidth, set a frequency calibration control output in response to the calibration tone being not found in the receiver bandwidth, and output the frequency calibration control output to the LO signal generation circuit, wherein the LO signal generation circuit adjusts an LO frequency of the LO signal in response to the frequency calibration control output.

According to a second aspect of the present invention, an exemplary calibration system is disclosed. The exemplary calibration system includes a calibration signal source and a first system. The calibration signal source is arranged to generate a calibration reference signal. The first system includes a first local oscillator (LO) signal generation circuit, a first receiver (RX) circuit, and a first calibration circuit. The first LO signal generation circuit is arranged to generate a first LO signal according to a first reference clock. The first LO signal generation circuit includes a first active oscillator that is arranged to generate the first reference clock. The first active oscillator includes at least one active component. The first RX circuit is arranged to generate a first processed RX signal by processing a first RX input signal according to the first LO signal, wherein the first RX input signal is obtained from the calibration reference signal. The first calibration circuit is arranged to check a signal characteristic of the first processed RX signal by detecting if a calibration tone exists within a receiver bandwidth, set a first frequency calibration control output in response to the calibration tone being not found in the receiver bandwidth, and output the first frequency calibration control output to the first LO signal generation circuit, wherein the first LO signal generation circuit adjusts an LO frequency of the first LO signal in response to the first frequency calibration control output.

According to a third aspect of the present invention, an exemplary local oscillator (LO) signal calibration method is disclosed. The exemplary LO signal calibration method includes: generating, by a calibration signal source, a calibration reference signal; generating a first LO signal according to a first reference clock, wherein the first reference clock is generated by a first active oscillator, and the first active oscillator comprises at least one active component; generating a first processed RX signal by processing a first RX input signal according to the first LO signal, wherein the first RX input signal is obtained from the calibration reference signal; checking a signal characteristic of the first processed RX signal by detecting if a calibration tone exists within a receiver bandwidth; and setting a first frequency calibration control output in response to the calibration tone being not found in the receiver bandwidth, wherein an LO frequency of the first LO signal is adjusted in response to the first frequency calibration control output.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The present invention proposes a crystal-less (XOless) technique for a wireless system. For example, the XOless technique may be integrated in a wireless system chip. Since an off-chip oscillator such as a crystal oscillator (XO) is not needed by the proposed wireless system chip, a BOM cost and a PCB area of an application device using the proposed wireless system chip can be reduced. Compared to a reference clock generated from an off-chip crystal oscillator, a reference clock generated from an on-chip active oscillator may have less stability and accuracy. The present invention further proposes a low-cost frequency calibration scheme. Further details of the proposed XOless technique and the proposed low-cost frequency calibration scheme are described with reference to the accompanying drawings.

Figure 1:
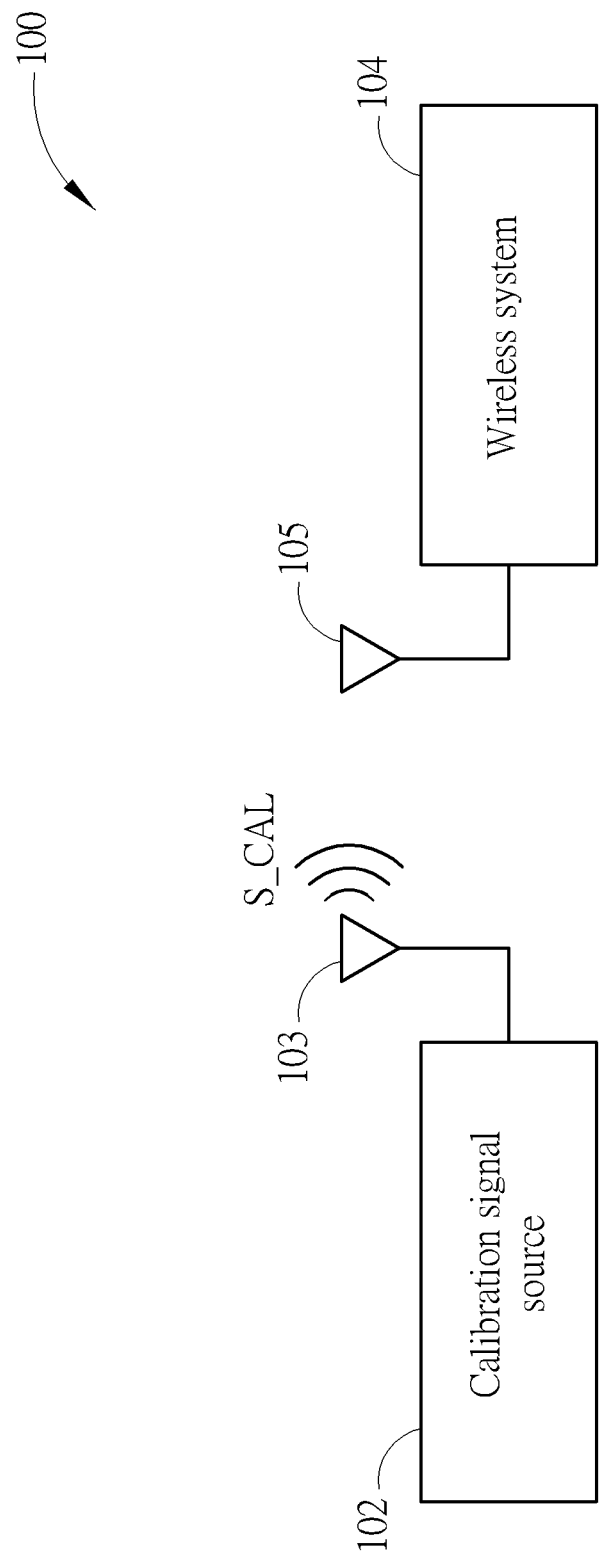
FIG. 1 is a diagram illustrating a first calibration system according to an embodiment of the present invention.

FIG. 1 is a diagram illustrating a first calibration system according to an embodiment of the present invention. The calibration system 100 includes a calibration signal source 102 and at least one wireless system 104. For clarity and simplicity, only one wireless system 104 is shown in FIG. 1, where the wireless system 104 is a device under test (DUT). The calibration signal source 102 is arranged to transmit a calibration reference signal S_CAL via an antenna 103. For example, the calibration reference signal S_CAL is a continuous waveform (CW) signal with a calibration tone (e.g., a CW frequency $f_0$ with approximate zero ppm frequency error). Unexpected interfaces shall be avoided during the calibration process. The wireless system 104 receives the calibration reference signal S_CAL from an antenna 105, and down-converts a receiver (RX) signal obtained from the calibration reference signal S_CAL received via the antenna 105 to generate a down-converted RX signal. The wireless system 104 checks existence of the calibration tone in the down-converted RX signal. Each of the up-conversion process and the down-conversion process requires a local oscillator (LO) signal with a proper LO frequency setting. If an LO frequency of an LO signal used by the wireless system 104 is close to the CW frequency $f_0$ of the calibration reference signal S_CAL, the calibration tone is within a limited receiver intermediate frequency (IF) bandwidth, and can be found in the down-converted RX signal. However, if an LO frequency of an LO signal used by the wireless system 104 is largely deviated from the CW frequency $f_0$ of the calibration reference signal S_CAL, the calibration tone is beyond the limited receiver IF bandwidth, and cannot be found in the down-converted RX signal. In this embodiment, the wireless system 104 performs frequency calibration according to a checking result. For example, an internal oscillator of the wireless system 104 is adjusted for achieving frequency calibration. For another example, an internal frequency synthesizer of the wireless system 104 is adjusted for achieving frequency calibration. For yet another example, an internal oscillator and an internal frequency synthesizer of the wireless system 104 are both adjusted for achieving frequency calibration.

Figure 2:
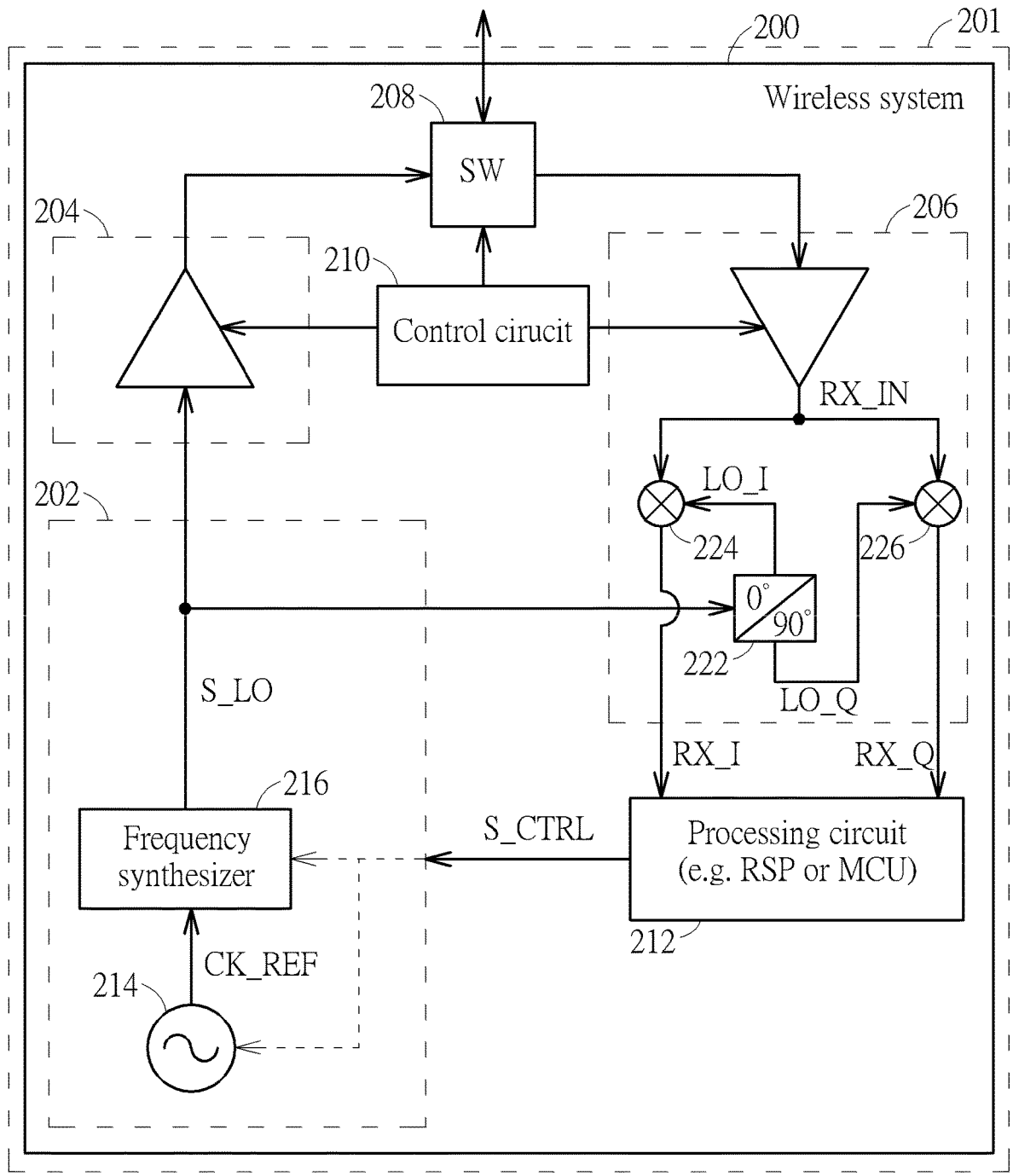
FIG. 2 is a diagram illustrating a first wireless system according to an embodiment of the present invention.

FIG. 2 is a diagram illustrating a first wireless system according to an embodiment of the present invention. The wireless system 104 shown in FIG. 1 may be implemented using the wireless system 200 shown in FIG. 2. For example, the wireless system 200 may be a Radio Detection and Ranging (radar) system, such as a frequency modulated continuous waveform (FMCW) radar system, a phase modulated continuous wave (PMCW) radar system, a micro-Doppler radar system, or a pulse-Doppler radar system. For another example, the wireless system 200 may be an automotive system such as an automotive radar system. In this embodiment, the wireless system 200 is implemented on a chip 201, and therefore has a plurality of on-chip components. As shown in FIG. 1, the wireless system 200 includes an LO signal generation circuit 202, a transmitter (TX) circuit 204, a receiver (RX) circuit 206, a switch circuit (denoted by "SW") 208, a control circuit 210, and a processing circuit 212.

The LO signal generation circuit 202 is arranged to generate an LO signal S_LO according to a reference clock CK_REF. In this embodiment, the LO signal generation circuit 202 includes an active oscillator 214 and a frequency synthesizer 216. The active oscillator 214 includes at least one active component (e.g., transistor(s) and/or amplifier(s)), and does not include an electromechanical resonator such as a crystal, a bulk acoustic wave (BAW) resonator, or a microelectromechanical system (MEMS) resonator. That is, the active oscillator 214 is an electromechanical-resonator-less oscillator (e.g., a crystal-less oscillator), and does not consist of passive components (e.g., inductor(s), resistor(s), and/or capacitor(s)) only. For example, the active oscillator 214 may be an LC oscillator having an amplifier circuit and an LC frequency-selective network, where the LC frequency-selective network consists of on-chip passive components only, and is used to create a resonator needed for reference clock generation. For another example, the active oscillator 102 may be an RC oscillator having an amplifier circuit and an RC frequency-selective network, where the RC frequency-selective network consists of on-chip passive components only, and is used to create a resonator needed for reference clock generation. To put it simply, the active oscillator 102 is an on-chip oscillator circuit arranged to generate and output the reference clock CK_REF. The reference clock CK_REF may act as a system clock of the wireless system 200. Hence, the reference clock CK_REF generated from the active oscillator 214 may be used to create periodical signals needed by normal operations of other on-chip components.

In this embodiment, pin(s) of the chip 201 are not coupled to an off-chip oscillator when the wireless system 200 is in a normal operation. For example, the off-chip oscillator is a crystal oscillator which uses the mechanical resonance of a vibrating crystal of piezoelectric material to create an electrical signal with a precise frequency. In other words, a normal operation of the wireless system 200 can be achieved with the use of the internal reference clock CK_REF provided by the on-chip oscillator (i.e., active oscillator 102 that is a crystal-less oscillator), and does not require an external reference clock supplied from the off-chip oscillator such as a typical crystal oscillator. Since the off-chip oscillator can be omitted in an application device that uses the proposed wireless system 200, the BOM cost and the PCB area of the application device using the proposed wireless system 200 can be reduced.

In this embodiment, a reference frequency of the reference clock CK_REF generated from the active oscillator 214 may be different from (e.g., higher than or lower than) an LO frequency needed by the TX circuit 204 and the RX circuit 206. Hence, the frequency synthesizer 216 is a frequency processing circuit designed to process the reference clock CK_REF for creating the LO signal S_LO with the needed LO frequency. For example, the frequency synthesizer 216 may include a phase-locked loop (PLL) circuit, a frequency multiplier circuit, and/or a frequency divider circuit, depending upon the discrepancy between the LO frequency of the LO signal S_LO and the reference frequency of the reference clock CK_REF.

The TX circuit 204 and the RX circuit 206 may share the same off-chip antenna (e.g., antenna 105 shown in FIG. 1) through the switch circuit 208 under the control of the control circuit 210. Specifically, the switch circuit 208 is a transmit/receive (TR) switch that is capable of alternately connecting the TX circuit 204 and the RX circuit 206 a shared antenna. When the wireless system 200 operates under a TX mode, the control circuit 210 may turn off the RX circuit 206, and may further instruct the switch circuit 208 to couple an output port of the TX circuit 204 to the off-chip antenna (e.g., antenna 105 shown in FIG. 1). When the wireless system 200 operates under an RX mode, the control circuit 210 may turn off the TX circuit 204, and may further instruct the switch circuit 208 to couple an input port of the RX circuit 206 to the off-chip antenna (e.g., antenna 105 shown in FIG. 1).

The TX circuit 204 is used to perform an up-conversion process that converts a TX signal from a lower frequency to a higher frequency for signal transmission via the off-chip antenna. The RX circuit 206 is used to receive an RX signal from the off-chip antenna, and perform a down-conversion process that converts the RX signal from a higher frequency to a lower frequency for signal reception. The LO frequency of the LO signal S_LO should be properly set to meet requirements of the up-conversion process and the down-conversion process. In a case where the wireless system 200 is a radar system (e.g., an automotive radar system or a non-automotive radar system), the LO signal S_LO may have the LO frequency at 24 GHz, 60 GHz, 77 GHz, or 79 GHz. However, this is for illustrative purposes only, and is not meant to be a limitation of the present invention.

Compared to an external reference clock generated from an off-chip crystal oscillator, an internal reference clock generated from an on-chip active oscillator may have less stability and accuracy. Hence, the present invention further proposes a frequency calibration scheme for calibrating a frequency error of the LO signal S_LO that mainly results from unstability and inaccuracy of the on-chip active oscillator 214. After the LO frequency of the LO signal S_LO is properly calibrated, a frequency error of a TX signal transmitted over the air can be reduced, and a transmit frequency of the TX signal can pass the FCC/ETSI emission regulation.

The frequency error may be calibrated in a final test (FT) stage of the assembly line, or may be calibrated in a mass production (MP) line. When the proposed frequency calibration scheme is enabled, the wireless system 200 is controlled to operate in the RX mode, where the switch circuit 208 couples an input port of the RX circuit 206 to the off-chip antenna, and the TX circuit 202 is turned off to avoid LO signal leakage.

An in-phase/quadrature (I/Q) modulation scheme may be employed by the wireless system 200 for signal transmission, and an I/Q demodulation scheme may be employed by the wireless system 200 for signal reception. Taking the RX circuit 206 for example, it includes a quadrature phase splitter 222, an in-phase mixer 224, and a quadrature mixer 226. The RX circuit 206 generates a down-converted RX signal by performing down-conversion upon an RX input signal RX_IN according to the LO signal S_LO. The down-converted RX signal includes a down-converted in-phase signal RX_I and a down-converted quadrature signal RX_Q. The quadrature phase splitter 222 is arranged to generate an in-phase LO signal LO_I and a quadrature LO signal LO_Q according to the LO signal S_LO. For example, the LO signal S_LO and the in-phase LO signal LO_I may have the same frequency and the same phase; and the LO signal S_LO and the quadrature LO signal LO_Q may have the same frequency and a 90-degree phase difference. The in-phase mixer 224 is arranged to mix the RX input signal RX_IN and the in-phase LO signal LO_I to generate the down-converted in-phase signal RX_I. The quadrature mixer 226 is arranged to mix the RX input signal RX_IN and the quadrature LO signal LO_Q to generate the down-converted quadrature signal RX_Q.

Since I/Q demodulation is used by the RX circuit 206, either of the positive frequency tone and the negative frequency tone can be detected. Hence, the processing circuit 212 may act as a calibration circuit used to process the down-converted RX signal (RX_I, RX_Q) for frequency calibration. For example, the processing circuit 212 may be an on-chip microcontroller unit (MCU) or an on-chip radar signal processor (RSP). The processing circuit 212 is arranged to generate a frequency calibration control output S_CTRL according to a signal characteristic of the down-converted RX signal (RX_I, RX_Q), and output the frequency calibration control output S_CTRL to the LO signal generation circuit 202. For example, the frequency calibration control output S_CTRL may be a calibration signal output or a calibration data output. The LO signal generation circuit 202 adjusts the LO frequency of the LO signal S_LO in response to the frequency calibration control output S_CTRL. In this embodiment, the processing circuit 212 may check the signal characteristic of the down-converted RX signal (RX_I, RX_Q) by detecting existence of a calibration tone within a receiver IF bandwidth centered at the current LO frequency (which is a direct current (DC) frequency of the receiver IF bandwidth). Specifically, the calibration signal source 102 shown in FIG. 1 transmits the calibration reference signal S_CAL with the calibration tone (e.g., an IF tone having a CW frequency $f_0$ with approximate zero ppm frequency error). The down-converted RX signal (RX_I, RX_Q) provides a representation of the IF signal. When the LO frequency of the LO signal S_LO is close to the CW frequency $f_0$, the calibration tone (e.g., IF tone having the CW frequency $f_0$) can be found in the output spectrum of the down-converted RX signal (RX_I, RX_Q). In other words, existence of the calibration tone within the receiver IF bandwidth centered at the current LO frequency indicates that the current LO frequency of the LO signal S_LO is close to the CW frequency $f_0$. Hence, when the wireless system 200 operates in the TX mode, the TX circuit 204 using the current LO frequency of the LO signal S_LO can achieve signal transmission without frequency error or with a small frequency error.

When the LO frequency of the LO signal S_LO is largely deviated from the target LO frequency, the calibration tone (e.g., IF tone having the CW frequency $f_0$) is beyond the receiver IF bandwidth, and cannot be found in the output spectrum of the down-converted RX signal (RX_I, RX_Q). In other words, absence of the calibration tone within the receiver IF bandwidth centered at the current LO frequency indicates that the current LO frequency of the LO signal S_LO is largely deviated from the target LO frequency. The processing circuit 212 generates the frequency calibration control output S_CTRL for frequency calibration of the LO signal S_LO.

In a first exemplary calibration design, the active oscillator 214 receives the frequency calibration control output S_CTRL, and adjusts the reference frequency of the reference clock CK_REF according to the frequency calibration control output S_CTRL. It should be noted that the frequency synthesizer 216 may not adjust the reference frequency of the reference clock CK_REF in response to the frequency calibration control output S_CTRL. Since the LO signal S_LO is derived from the reference clock CK_REF, the LO frequency of the LO signal S_LO is calibrated due to the frequency calibration of the reference clock CK_REF.

In a second exemplary calibration design, the frequency synthesizer 216 receives the frequency calibration control output S_CTRL, and adjusts its synthesizer setting according to the frequency calibration control output S_CTRL. Hence, the LO frequency of the LO signal S_LO is calibrated due to the adjusted synthesizer setting. It should be noted that the active oscillator 214 may not adjust the reference frequency of the reference clock CK_REF in response to the frequency calibration control output S_CTRL.

In a third exemplary calibration design, the frequency calibration control output S_CTRL is supplied to both of the active oscillator 214 and the frequency synthesizer 216. Hence, the active oscillator 214 receives the frequency calibration control output S_CTRL, and adjusts the reference frequency of the reference clock CK_REF according to the frequency calibration control output S_CTRL. In addition, the frequency synthesizer 216 receives the frequency calibration control output S_CTRL, and adjusts its synthesizer setting according to the frequency calibration control output S_CTRL. Since the LO signal S_LO is derived from the reference clock CK_REF according to the synthesizer setting, the LO frequency of the LO signal S_LO is calibrated due to the frequency calibration of the reference clock CK_REF and the adjusted synthesizer setting.

Figure 3:
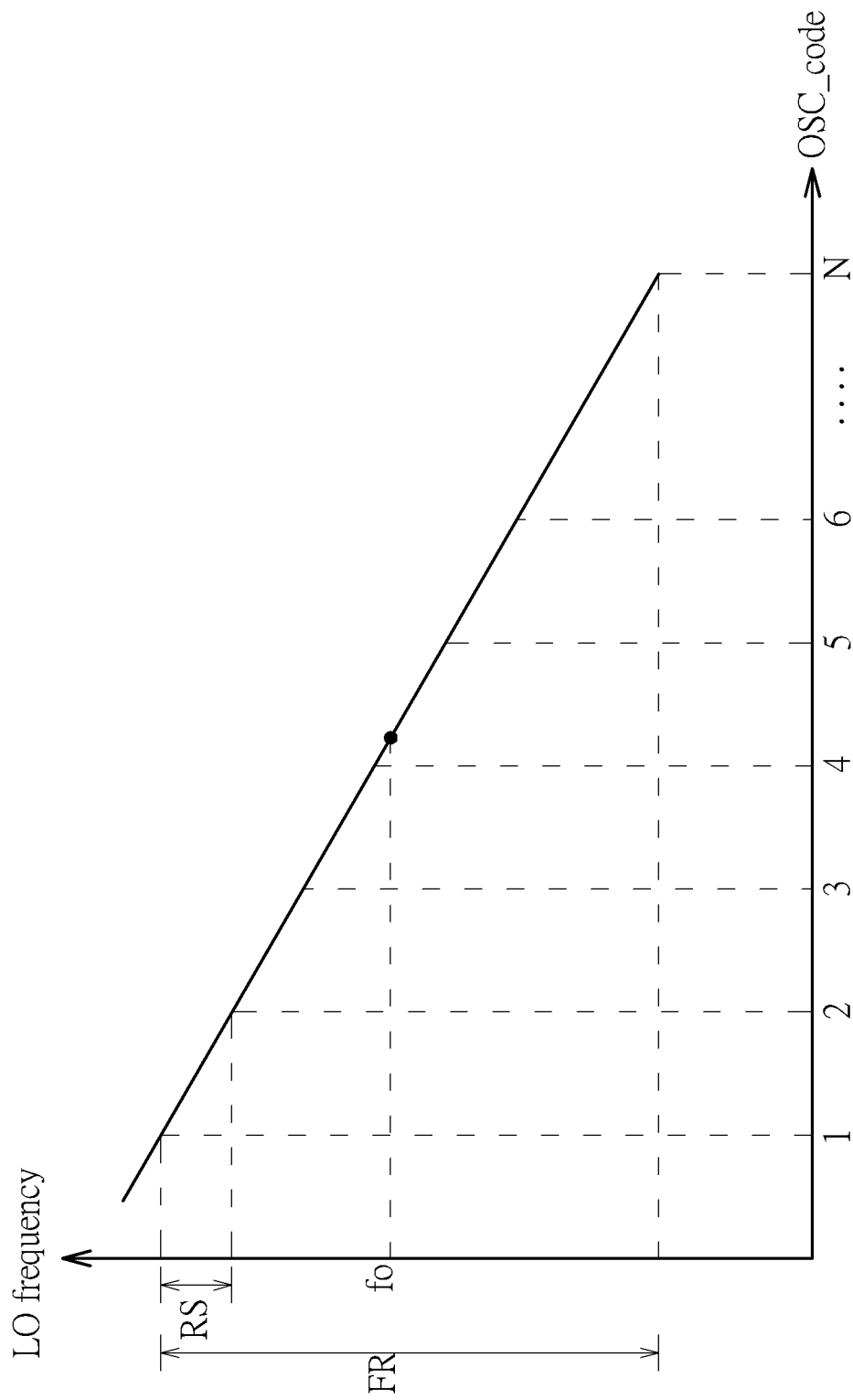
FIG. 3 is a diagram illustrating the relationship between an LO frequency of an LO signal and a control code of an active oscillator according to an embodiment of the present invention.
Figure 4:
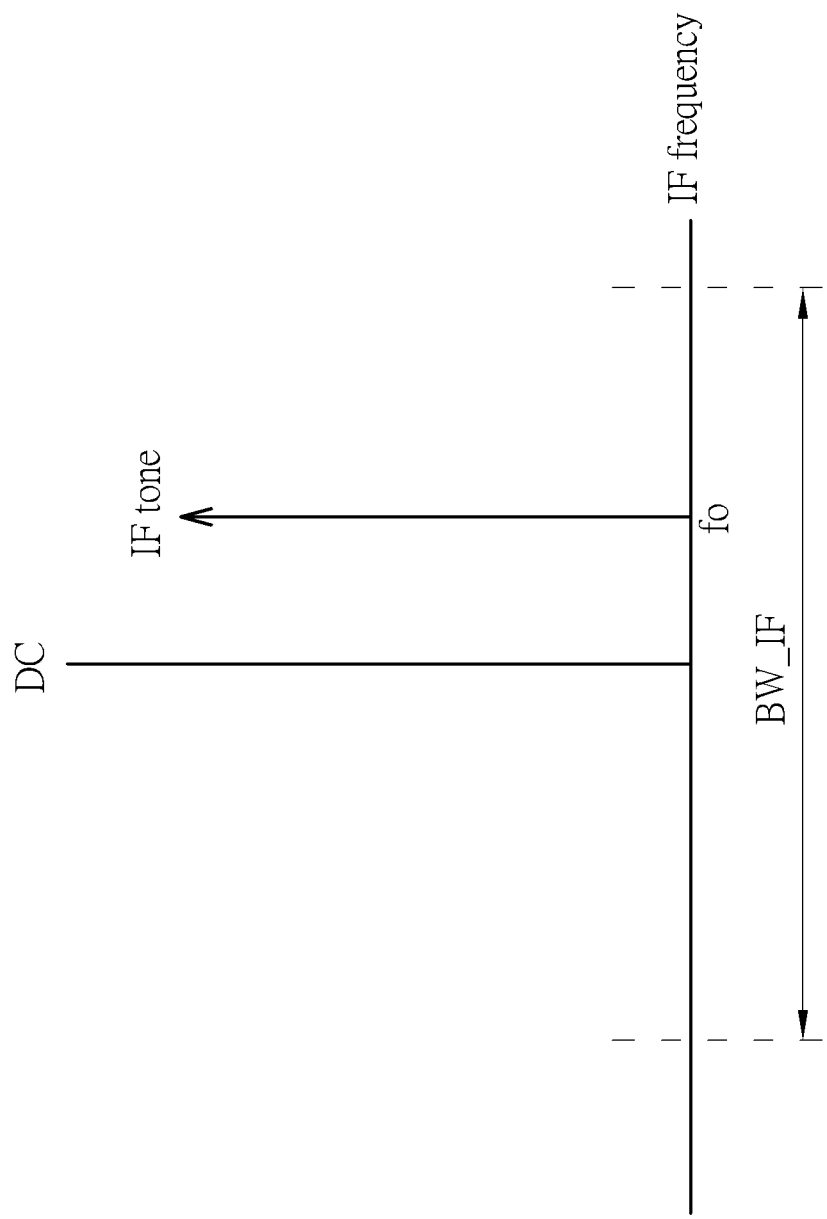
FIG. 4 is a diagram illustrating an output spectrum of a down-converted RX signal according to an embodiment of the present invention.

Please refer to FIG. 3 in conjunction with FIG. 4. FIG. 3 is a diagram illustrating the relationship between the LO frequency of the LO signal S_LO and the control code OSC_code of the active oscillator 214 according to an embodiment of the present invention. FIG. 4 is a diagram illustrating an output spectrum of the down-converted RX signal according to an embodiment of the present invention. The calibration reference signal S_CAL with the calibration tone (e.g., IF tone having the CW frequency $f_0$ with approximate zero ppm frequency error) is transmitted from the calibration signal source 102 for frequency calibration of the wireless system 104/200. For example, the CW frequency $f_0$ is set by a value equal to a target LO frequency. Hence, one objective of the proposed frequency calibration is to make the LO frequency of the LO signal S_LO close to $f_0$.

As shown in FIG. 3, the LO frequency of the LO signal S_LO can be adjusted by changing the control code OSC_code from 1 to N. The adjustment frequency range FR should be assured to cover the desired CW frequency $f_0$. The calibration tone at the CW frequency $f_0$ can be down-converted to an IF signal (i.e., down-converted RX signal consisting of the in-phase RX signal RX_I and the quadrature RX signal RX_Q), and the LO frequency is controlled by the control code OSC_code of the active oscillator 214. When OSC_code=1, the calibration tone at the CW frequency $f_0$ is beyond an output spectrum having the receiver IF bandwidth BW_IF and centered at the current LO frequency set by the control code OSC_code. Since the calibration tone cannot be found in the output spectrum of the down-converted RX signal (RX_I, RX_Q), the frequency calibration control output S_CTRL is adjusted by increasing the control code OSC_code.

When OSC_code=2, the calibration tone at the CW frequency $f_0$ is beyond an output spectrum having the receiver IF bandwidth BW_IF and centered at the current LO frequency set by the control code OSC_code. Since the calibration tone is still not found in the output spectrum of the down-converted RX signal (RX_I, RX_Q), the frequency calibration control output S_CTRL is further adjusted by increasing the control code OSC_code.

When OSC_code=3, the calibration tone at the CW frequency $f_0$ is beyond an output spectrum having the receiver IF bandwidth BW_IF and centered at the current LO frequency set by the control code OSC_code. Since the calibration tone is still not found in the output spectrum of the down-converted RX signal (RX_I, RX_Q), the frequency calibration control output S_CTRL is further adjusted by increasing the control code OSC_code.

When OSC_code=4, the calibration tone at the CW frequency $f_0$ is within an output spectrum having the receiver IF bandwidth BW_IF and centered at the current LO frequency set by the control code OSC_code, as illustrated in FIG. 4. Since the calibration tone is successfully detected in the output spectrum of the down-converted RX signal (RX_I, RX_Q), the optimized control code (e.g., OSC_code=4) is found, and the frequency calibration procedure is done. When the optimized control code (e.g., OSC_code=4) is used under a normal operation of the wireless system 104/200, the LO frequency of the LO signal S_LO is ensured to be close to the CW frequency $f_0$. Hence, the TX signal transmitted from the off-chip antenna (e.g., antenna 105 shown in FIG. 1) is ensured to have an accurate RF mW (microwave) frequency or an accurate mmWave (millimeter wave) frequency.

It should be noted that the observation frequency region is dependent on the receiver IF bandwidth BW_IF. Hence, the receiver IF bandwidth BW_IF should be assured to be larger than the oscillator tuning resolution RS.

Figure 5:
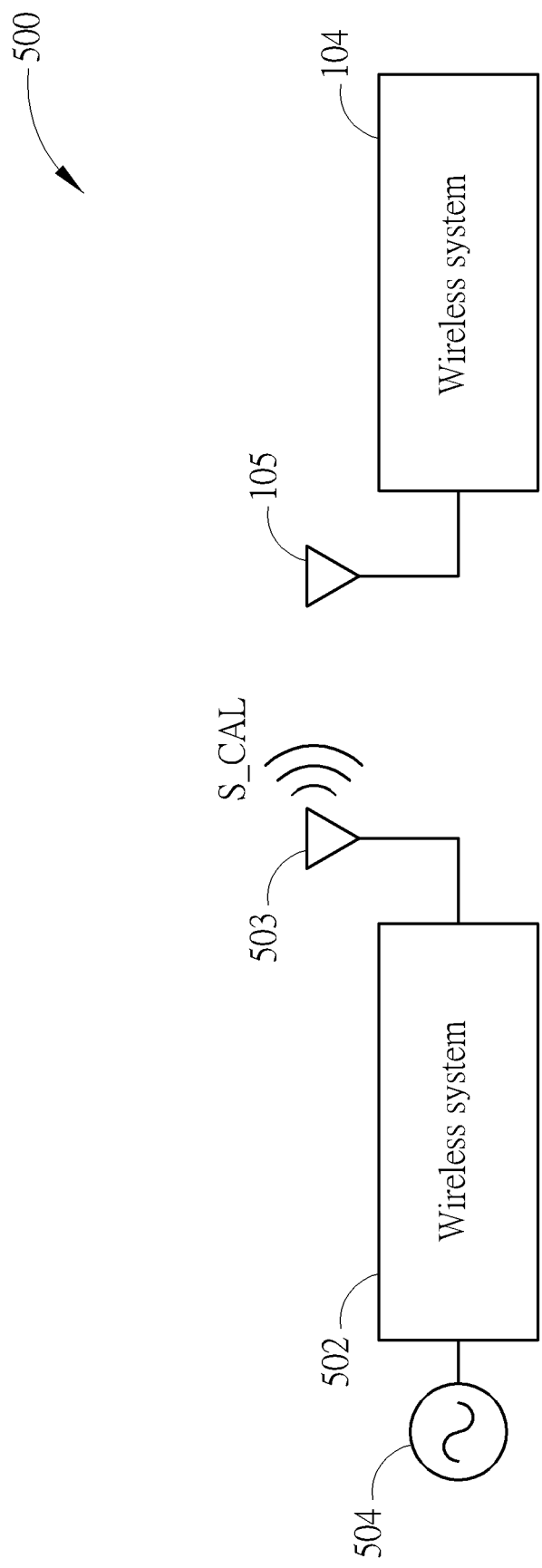
FIG. 5 is a diagram illustrating a second calibration system according to an embodiment of the present invention.

The calibration signal source 102 may be a standard signal source used for transmitting the calibration reference signal S_CAL with the CW frequency $f_0$ for frequency calibration of the wireless system 104. In an alternative design, the calibration signal source 102 may be implemented using one of DUTs to serve as a golden sample. FIG. 5 is a diagram illustrating a second calibration system according to an embodiment of the present invention. The major difference between the calibration systems 100 and 500 is that the calibration system 500 uses a wireless system 502 as a calibration signal source, where the wireless systems 104 and 502 have the same circuit architecture. For example, the wireless systems 104 and 502 are identical radar system chips. Like the calibration signal source 102 shown in FIG. 1, the wireless system 502 is used to transmit a calibration reference signal S_CAL via an antenna 503. For example, the calibration reference signal S_CAL is a continuous waveform (CW) signal with a calibration tone (e.g., a CW frequency $f_0$ with approximate zero ppm frequency error). To achieve the CW frequency $f_0$ with approximate zero ppm frequency error, an external high-precision oscillator 504 is connected to the wireless system 502 during the calibration procedure. Since an accurate external reference clock is supplied from the external high-precision oscillator 504 to the wireless system 502, the wireless system 502 can generate the calibration reference signal S_CAL according to the accurate external reference clock. For example, the external high-precision oscillator 504 may be an electromechanical resonator based oscillator such as a temperature compensated crystal oscillator (TCXO).

Figure 6:
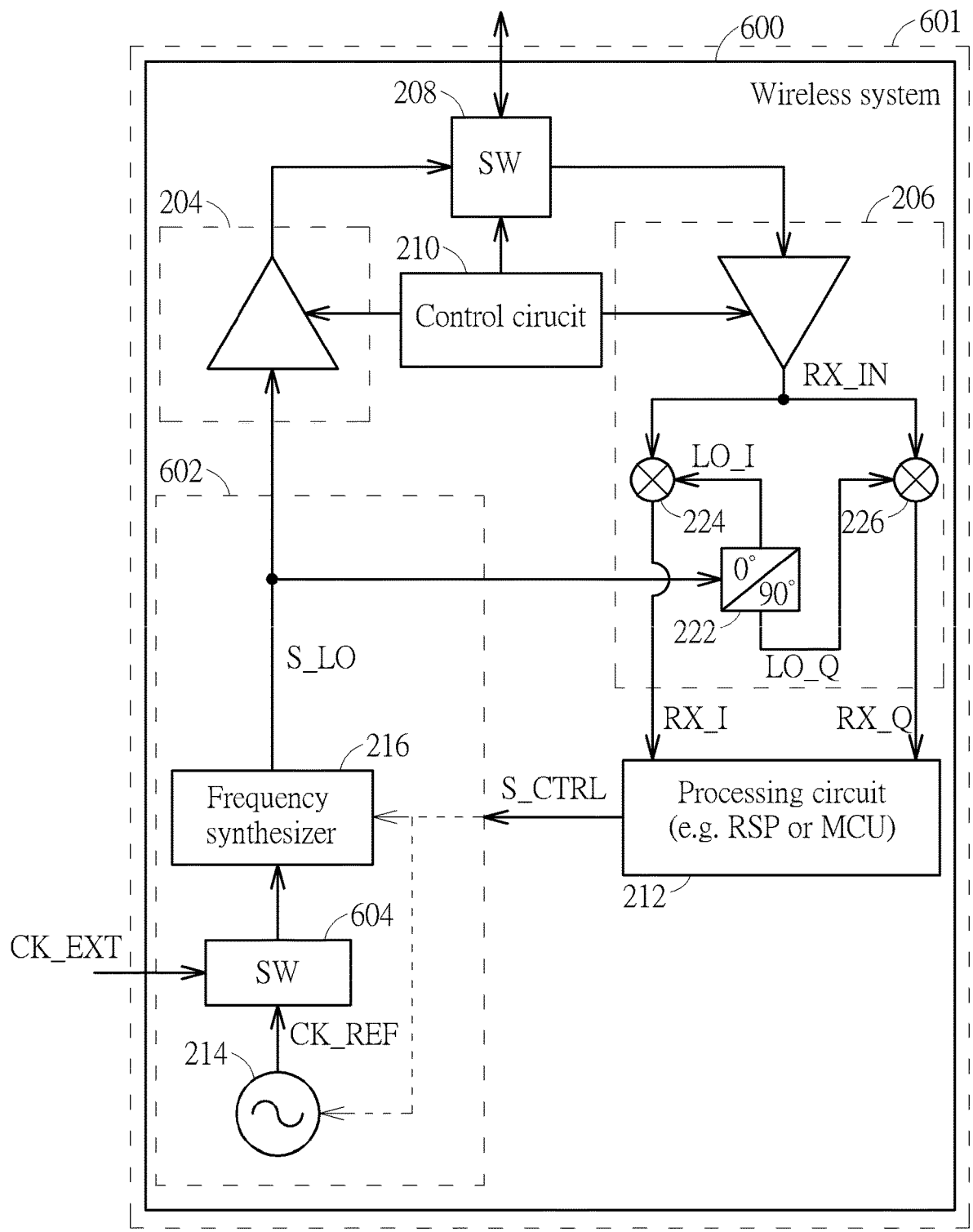
FIG. 6 is a diagram illustrating a second wireless system according to an embodiment of the present invention.

FIG. 6 is a diagram illustrating a second wireless system according to an embodiment of the present invention. Each of the wireless systems 104 and 502 shown in FIG. 5 may be implemented using the wireless system 600 shown in FIG. 6. For example, the wireless system 600 may be a Radio Detection and Ranging (radar) system, such as a frequency modulated continuous waveform (FMCW) radar system, a phase modulated continuous wave (PMCW) radar system, a micro-Doppler radar system, or a pulse-Doppler radar system. For another example, the wireless system 600 may be an automotive system such as an automotive radar system. In this embodiment, the wireless system 600 is implemented on a chip 601, and therefore has a plurality of on-chip components. The major difference between the wireless systems 200 and 600 is that the wireless system 600 further supports the use of an off-chip oscillator during a frequency calibration procedure. As shown in FIG. 6, the LO signal generation circuit 602 includes a switch circuit (denoted by "SW") 604. The switch circuit 604 is coupled to the active oscillator 214 for receiving the internal reference clock CK_REF. When the wireless system 600 is not selected as a golden sample (e.g., wireless system 104 shown in FIG. 5), no off-chip oscillator is connected to pin(s) of the chip 601, and the switch circuit 604 is controlled by the processing circuit (e.g., RSP or MCU) 212 to output the internal reference clock CK_REF to the frequency synthesizer 216. The wireless system 600 is controlled to operate in a TX mode during the frequency calibration procedure, and the aforementioned on-chip frequency calibration is performed to calibrate the LO frequency of the LO signal S_LO.

When the wireless system 600 is selected as a golden sample (e.g., wireless system 502 shown in FIG. 5), an off-chip oscillator (e.g., external high-precision oscillator 504 shown in FIG. 5) is connected to pin(s) of the chip 601, and the switch circuit 604 is further coupled to the off-chip oscillator for receiving an external reference clock CK_EXT. Since the wireless system 600 is used as a golden sample for transmitting the calibration reference signal S_CAL, the wireless system 600 is controlled to operate in a TX mode during the frequency calibration procedure. Hence, the control circuit 210 may turn off the RX circuit 206, and may further instruct the switch circuit 208 to couple an output port of the TX circuit 204 to the off-chip antenna (e.g., antenna 503 shown in FIG. 5). In addition, the switch circuit 604 is controlled by the processing circuit (e.g., RSP or MCU) 212 to output the external reference clock CK_EXT to the frequency synthesizer 216. For example, the LO signal S_LO generated from the frequency synthesizer 216 may be a CW signal with a CW frequency $f_0$. In this way, the calibration reference signal S_CAL with the calibration tone (e.g., CW frequency $f_0$ with approximate zero ppm frequency error) can be transmitted via the off-chip antenna (e.g., antenna 503 shown in FIG. 5).

When there is more than one DUT (e.g., more than one wireless system 104), a calibration reference signal transmitted from a calibration signal source (e.g., calibration signal source 102 shown in FIG. 1 or wireless system 502 shown in FIG. 5) can be received by multiple DUTs for frequency calibration. In other words, a calibration system can use a single calibration signal source for achieving simultaneous frequency calibration of multiple DUTs.

Figure 7:
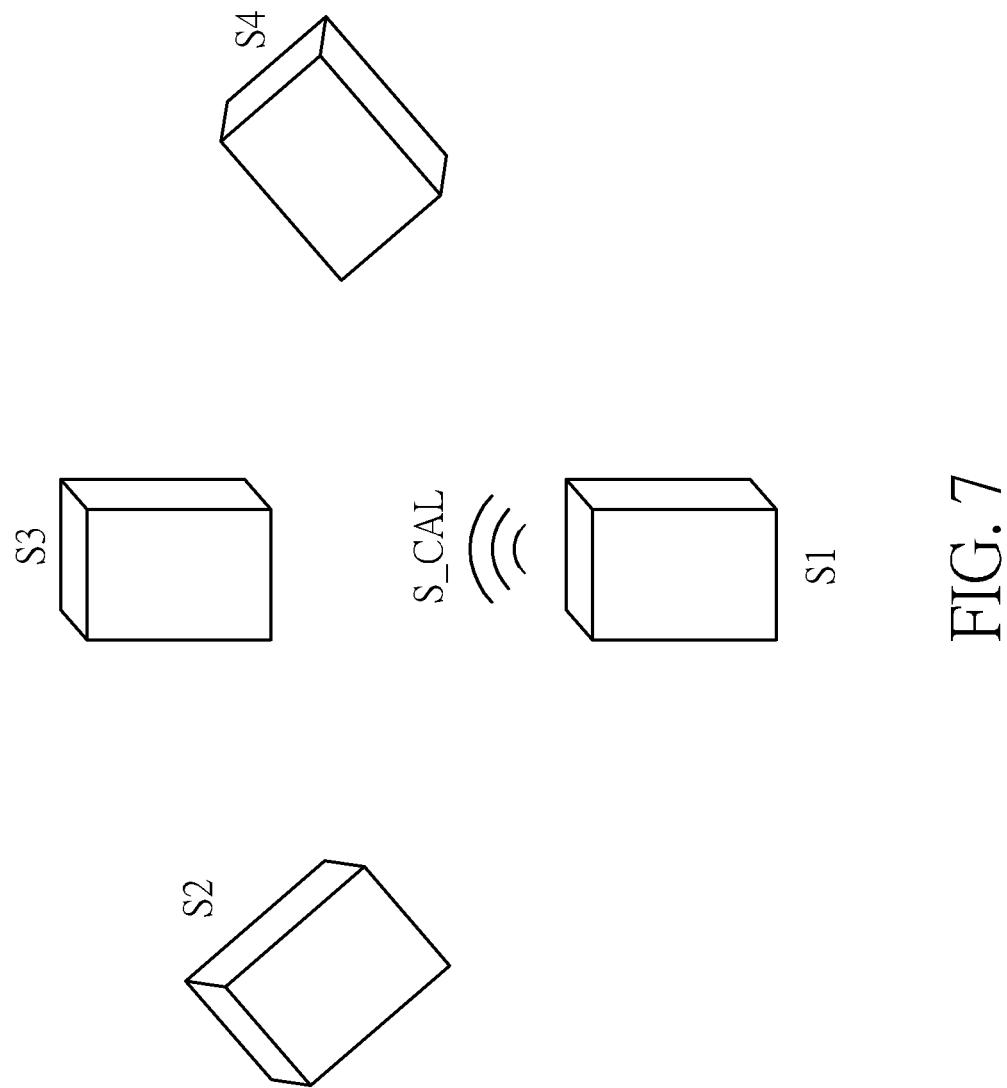
FIG. 7 is a diagram illustrating a calibration setup environment according to an embodiment of the present invention.

FIG. 7 is a diagram illustrating a calibration setup environment according to an embodiment of the present invention. The calibration setup environment may be used for production line calibration. For example, each of the wireless systems S1, S2, S3, and S4 may be implemented using the wireless system 600 shown in FIG. 6. The wireless system S1 is a DUT selected as a golden sample, such that an external reference clock CK_EXT provided from an off-chip oscillator is used for generating and transmitting a calibration reference signal S_CAL to multiple wireless systems S2, S3, and S4 under test. During the frequency calibration procedure, the wireless system S1 is controlled to operate in a TX mode, while each of the wireless systems S2, S3, and S4 is controlled to operate in an RX mode. The calibration reference signal S_CAL may be transmitted from the golden sample to one DUT in a line-of-sight manner or a multi-path reflection manner. Since the wireless systems S2, S3, and S4 have the same circuit architecture, the same frequency calibration procedure mentioned above can be performed by each of the wireless systems S2, S3, and S4 according to the calibration reference signal S_CAL with the calibration tone. In this way, LO frequencies of LO signals generated from LO signal generation circuits of the wireless systems S2, S3, and S4 can be calibrated simultaneously.

Alternatively, the calibration setup environment may be used for a satellite sensor application. The wireless systems S1, S2, S3, and S4 may be implemented in different radar sensors that are installed in a space for object detection with good coverage. All the radar sensors can operate in a Frequency-division multiple access (FDMA) mode or a Time-staggered frequency modulated continuous waveform (TS-FMCW) mode. They need frequency calibration to avoid frequency overlap interference due to each sensor's frequency error. For example, each of the wireless systems S1, S2, S3, and S4 may be implemented using the wireless system 200 shown in FIG. 2. The wireless system S1 is selected as a master device for generating and transmitting a calibration reference signal S_CAL to multiple wireless systems S2, S3, and S4. For example, the calibration reference signal S_CAL may be transmitted from the master device to one DUT in a line-of-sight manner or a multi-path reflection manner. Since the wireless system S1 is used as a master device for transmitting the calibration reference signal S_CAL, the wireless system S1 with the circuit architecture shown in FIG. 2 is controlled to operate in a TX mode. Hence, the control circuit 210 may turn off the RX circuit 206, and may further instruct the switch circuit 208 to couple an output port of the TX circuit 204 to the off-chip antenna (e.g., antenna 503 shown in FIG. 5). In addition, the internal reference clock CK_REF is used by the frequency synthesizer 216 to generate the LO signal S_LO, where the LO signal S_LO may be a CW signal with a CW frequency $f_0$. In this way, the calibration reference signal S_CAL with a calibration tone (e.g., a CW frequency $f_0+\Delta f$, where $\Delta f$ is a frequency offset resulting from the internal reference clock) can be transmitted via the off-chip antenna (e.g., antenna 103 shown in FIG. 1). During the frequency calibration procedure, the wireless system S1 is controlled to operate in a TX mode, while each of the wireless systems S2, S3, and S4 is controlled to operate in an RX mode. Since the wireless systems S2, S3, and S4 have the same circuit architecture, the same frequency calibration procedure mentioned above can be performed by each of the wireless systems S2, S3, and S4 according to the calibration reference signal S_CAL with the calibration tone. In this way, the wireless systems S2 finds a specific oscillator control code that corresponds to the calibration tone under a calibration mode, and refers to the specific oscillator control code found in the calibration mode to select and use another oscillator control code under a normal operation mode, thereby avoiding the undesired frequency overlap interference of wireless systems S1-S4. Similarly, the wireless systems S3 finds a specific oscillator control code that corresponds to the calibration tone under a calibration mode, and refers to the specific oscillator control code found in the calibration mode to select and use another oscillator control code under a normal operation mode, thereby avoiding the undesired frequency overlap interference of wireless systems S1-S4; and the wireless systems S4 finds a specific oscillator control code that corresponds to the calibration tone under a calibration mode, and refers to the specific oscillator control code found in the calibration mode to select and use another oscillator control code under a normal operation mode, thereby avoiding the undesired frequency overlap interference of wireless systems S1-S4.

As shown in FIG. 2/FIG. 6, the frequency calibration function can be integrated into the wireless system 200/600 in the chip 201/601. Thus, no expensive RF mW (microwave) test instrument or mmWave (millimeter wave) test instrument is needed, and no extra personal computer (PC) or microcontroller unit (MCU) is needed to read data from the test instrument and calibrate a frequency error by controlling the internal oscillator and/or internal frequency synthesizer. Further, since the same frequency calibration function can be integrated into each of a plurality of wireless systems 200/600, multiple wireless systems 200/600 can be calibrated at the same time. Moreover, one of the wireless systems 600 can be configured to receive an external reference clock from an external oscillator for acting as a golden sample which generates and transmits a calibration reference signal to the rest of the wireless systems 600, a standard signal source for generating and transmitting a calibration reference signal can be omitted. The proposed frequency calibration scheme can be easily implemented in a final test (FT) of the assembly line, or can be easily implemented in a mass production (MP) line.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system comprising:
    a local oscillator (LO) signal generation circuit, arranged to generate an LO signal according to a reference clock, wherein the LO signal generation circuit comprises:
        an active oscillator, arranged to generate the reference clock, wherein the active oscillator comprises at least one active component;
    a receiver (RX) circuit, arranged to generate a processed RX signal by processing an RX input signal according to the LO signal; and
    a calibration circuit, arranged to check a signal characteristic of the processed RX signal by detecting if a calibration tone exists within a receiver bandwidth, set a frequency calibration control output in response to the calibration tone being not found in the receiver bandwidth, and output the frequency calibration control output to the LO signal generation circuit, wherein the LO signal generation circuit adjusts an LO frequency of the LO signal in response to the frequency calibration control output.

2. The system of claim 1, wherein the system is implemented on a chip, and the active oscillator is an on-chip oscillator.

3. The system of claim 1, wherein the active oscillator is arranged to receive the frequency calibration control output, and adjust a reference frequency of the reference clock according to the frequency calibration control output.

4. The system of claim 1, wherein the processed RX signal comprises an in-phase signal and a quadrature signal, and the RX circuit comprises:
    a quadrature phase splitter, arranged to generate an in-phase LO signal and a quadrature LO signal according to the LO signal;
    an in-phase mixer, arranged to mix the RX input signal and the in-phase LO signal to generate the in-phase signal; and
    a quadrature mixer, arranged to mix the RX input signal and the quadrature LO signal to generate the quadrature signal.

5. The system of claim 1, wherein the system is a Radio Detection and Ranging (radar) system.

6. The system of claim 1, wherein the system is an automotive system.

7. A calibration system comprising:
    a calibration signal source, arranged to generate a calibration reference signal; and
    a first system comprising:
        a first local oscillator (LO) signal generation circuit, arranged to generate a first LO signal according to a first reference clock, wherein the first LO signal generation circuit comprises:
            a first active oscillator, arranged to generate the first reference clock, wherein the first active oscillator comprises at least one active component;
        a first receiver (RX) circuit, arranged to generate a first processed RX signal by processing a first RX input signal according to the first LO signal, wherein the first RX input signal is obtained from the calibration reference signal; and
        a first calibration circuit, arranged to check a signal characteristic of the first processed RX signal by detecting if a calibration tone exists within a receiver bandwidth, set a first frequency calibration control output in response to the calibration tone being not found in the receiver bandwidth, and output the first frequency calibration control output to the first LO signal generation circuit, wherein the first LO signal generation circuit adjusts an LO frequency of the first LO signal in response to the first frequency calibration control output.

8. The calibration system of claim 7, wherein the calibration signal source comprises:
  a second local oscillator (LO) signal generation circuit, arranged to generate a second LO signal according to a second reference clock; and
  a transmitter (TX) circuit, arranged to transmit the calibration reference signal according to the second LO signal.

9. The calibration system of claim 8, wherein the second reference clock is generated from a reference oscillator that comprises an electromechanical resonator.

10. The calibration system of claim 9, wherein the second LO signal generation circuit comprises:
  a second active oscillator, wherein the second active oscillator comprises at least one active component; and
  a switch circuit, coupled to the reference oscillator and the second active oscillator, wherein the switch circuit is arranged to select an output of the reference oscillator as the second reference clock.

11. The calibration system of claim 8, wherein the second LO signal generation circuit comprises:
  a second active oscillator, arranged to generate and output the second reference clock, wherein the second active oscillator comprises at least one active component.

12. The calibration system of claim 7, wherein the first system is implemented on a chip, and the first active oscillator is an on-chip oscillator.

13. The calibration system of claim 7, wherein the first processed RX signal comprises an in-phase signal and a quadrature signal, and the first RX circuit comprises:
  a quadrature phase splitter, arranged to generate an in-phase LO signal and a quadrature LO signal according to the first LO signal;
  an in-phase mixer, arranged to mix the first RX input signal and the in-phase LO signal to generate the in-phase signal; and
  a quadrature mixer, arranged to mix the first RX input signal and the quadrature LO signal to generate the quadrature signal.

14. The calibration system of claim 13, wherein under a condition that the calibration tone is not found in the first processed RX signal, the first active oscillator receives the first frequency calibration control output, and adjusts a reference frequency of the first reference clock according to the first frequency calibration control output.

15. The calibration system of claim 7, wherein the first active oscillator is arranged to receive the first frequency calibration control output, and adjust a reference frequency of the first reference clock according to the first frequency calibration control output.

16. The calibration system of claim 7, wherein the calibration reference signal is a continuous waveform (CW) signal.

17. The calibration system of claim 7, further comprising:
  a second system comprising:
    a second local oscillator (LO) signal generation circuit, arranged to generate a second LO signal according to a second reference clock, wherein the second LO signal generation circuit comprises:
      a second active oscillator, arranged to generate the second reference clock, wherein the second active oscillator comprises at least one active component;
    a second receiver (RX) circuit, arranged to generate a second processed RX signal by processing a second RX input signal according to the second LO signal, wherein the second RX input signal is obtained from the calibration reference signal; and
    a second calibration circuit, arranged to generate a second frequency calibration control output according to a signal characteristic of the second processed RX signal, and output the second frequency calibration control output to the second LO signal generation circuit, wherein the second LO signal generation circuit adjusts an LO frequency of the second LO signal in response to the second frequency calibration control output.

18. The calibration system of claim 17, wherein the second system further comprises:
  a switch circuit, coupled to the second active oscillator, wherein the switch circuit is not coupled to a reference oscillator that comprises an electromechanical resonator, and is arranged to output the second reference clock generated from the second active oscillator.

19. The calibration system of claim 17, wherein the first system, the second system, and the calibration signal source are identical chips.

20. The calibration system of claim 19, wherein the identical chips are Radio Detection and Ranging (radar) system chips.

21. The calibration system of claim 7, wherein the first system is a Radio Detection and Ranging (radar) system.

22. The calibration system of claim 7, wherein the first system is an automotive system.

23. The calibration system of claim 7, wherein the first system further comprises:
  a switch circuit, coupled to the first active oscillator, wherein the switch circuit is not coupled to a reference oscillator that comprises an electromechanical resonator, and is arranged to output the first reference clock generated from the first active oscillator.

24. The calibration system of claim 7, wherein the calibration signal source is a Radio Detection and Ranging (radar) system.

25. The calibration system of claim 7, wherein the calibration signal source is an automotive system.

26. The calibration system of claim 7, wherein the first system and the calibration signal source are identical chips.

27. The calibration system of claim 26, wherein the identical chips are Radio Detection and Ranging (radar) system chips.

28. A local oscillator (LO) signal calibration method comprising:
  generating, by a calibration signal source, a calibration reference signal;
  generating a first LO signal according to a first reference clock, wherein the first reference clock is generated by a first active oscillator, and the first active oscillator comprises at least one active component;
  generating a first processed RX signal by processing a first RX input signal according to the first LO signal, wherein the first RX input signal is obtained from the calibration reference signal;
  checking a signal characteristic of the first processed RX signal by detecting if a calibration tone exists within a receiver bandwidth; and
  setting a first frequency calibration control output in response to the calibration tone being not found in the receiver bandwidth, wherein an LO frequency of the first LO signal is adjusted in response to the first frequency calibration control output.

* * * * *